United States Patent
Forrest et al.

(10) Patent No.: US 10,340,187 B2
(45) Date of Patent: Jul. 2, 2019

(54) STRAIN RELIEF EPITAXIAL LIFT-OFF VIA PRE-PATTERNED MESAS

(71) Applicant: The Regents Of The University Of Michigan, Ann Arbor, MI (US)

(72) Inventors: Stephen R. Forrest, Ann Arbor, MI (US); Kyusang Lee, Ann Arbor, MI (US); Dejiu Fan, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/558,230

(22) PCT Filed: Mar. 18, 2016

(86) PCT No.: PCT/US2016/023171
§ 371 (c)(1),
(2) Date: Sep. 14, 2017

(87) PCT Pub. No.: WO2016/149629
PCT Pub. Date: Sep. 22, 2016

(65) Prior Publication Data
US 2018/0047627 A1     Feb. 15, 2018

Related U.S. Application Data

(60) Provisional application No. 62/134,833, filed on Mar. 18, 2015.

(51) Int. Cl.
*H01L 21/02* (2006.01)
*H01L 31/18* (2006.01)
(Continued)

(52) U.S. Cl.
CPC .......... *H01L 21/78* (2013.01); *H01L 21/7813* (2013.01); *H01L 31/1896* (2013.01);
(Continued)

(58) Field of Classification Search
CPC . H01L 21/78; H01L 31/1896; H01L 21/7813; H01L 33/0079; C09K 13/00; C30B 33/08; Y02E 10/50
See application file for complete search history.

(56) References Cited

U.S. PATENT DOCUMENTS

| 4,440,153 A | 4/1984 | Melchior |
| 5,288,337 A | 2/1994 | Mitchell |

(Continued)

FOREIGN PATENT DOCUMENTS

| EP | 2521189 | 11/2012 |
| JP | 2005019590 | 1/2005 |

(Continued)

OTHER PUBLICATIONS

International Search Report, PCT/US2016/023171, dated Jun. 2, 2016.
(Continued)

*Primary Examiner* — Shamim Ahmed
(74) *Attorney, Agent, or Firm* — Finnegan, Henderson, Farabow, Garrett & Dunner LLP

(57) ABSTRACT

Disclosed herein are methods to eliminate or reduce the peeling-off of epitaxial lifted-off thin film epilayers on secondary host substrates that allow for the fabrication of high yield ELO processed thin film devices. The methods employ patterned strain-relief trenches.

20 Claims, 4 Drawing Sheets

(51) Int. Cl.
| | |
|---|---|
| *H01L 21/78* | (2006.01) |
| *C30B 33/08* | (2006.01) |
| *C09K 13/00* | (2006.01) |
| *H01L 33/00* | (2010.01) |

(52) U.S. Cl.
CPC .............. *C09K 13/00* (2013.01); *C30B 33/08* (2013.01); *H01L 33/0079* (2013.01); *Y02E 10/50* (2013.01)

(56) References Cited

U.S. PATENT DOCUMENTS

| | | | |
|---|---|---|---|
| 5,939,733 | A | 8/1999 | Sato |
| 8,110,425 | B2 | 2/2012 | Yun |
| 8,378,385 | B2 | 2/2013 | Forrest et al. |
| 2004/0121568 | A1 | 6/2004 | Kim et al. |
| 2005/0081909 | A1 | 4/2005 | Paull |
| 2008/0048102 | A1 | 2/2008 | Kurtz et al. |
| 2008/0050858 | A1 | 2/2008 | Ono et al. |
| 2009/0044860 | A1 | 2/2009 | Pan et al. |
| 2010/0047959 | A1 | 2/2010 | Cornfeld et al. |
| 2010/0317132 | A1 | 12/2010 | Rogers et al. |
| 2011/0094564 | A1 | 4/2011 | McCall |
| 2011/0240104 | A1 | 10/2011 | Lee et al. |
| 2011/0266561 | A1 | 11/2011 | Rogers et al. |
| 2011/0294281 | A1 | 12/2011 | Zang et al. |
| 2012/0138122 | A1 | 6/2012 | Whitlock et al. |
| 2013/0037095 | A1 | 2/2013 | Forrest et al. |
| 2013/0043214 | A1 | 2/2013 | Forrest et al. |
| 2013/0228221 | A1 | 9/2013 | Moslehi et al. |
| 2014/0338726 | A1 | 11/2014 | Nobori |
| 2016/0329457 | A1 | 11/2016 | Forrest et al. |

FOREIGN PATENT DOCUMENTS

| | | |
|---|---|---|
| WO | WO 2008/024201 | 2/2008 |
| WO | WO 2011/049569 | 4/2011 |
| WO | WO 2011/066029 | 6/2011 |
| WO | WO 2013/006803 | 1/2013 |

OTHER PUBLICATIONS

Horng et al: "Thin Film Solar Cells Fabricated Using Cross-Shaped Pattern Epilayer Lift-Off Technology for Substrate Recycling Applications", IEEE Transactions on Electron Devices, vol. 59, No. 3, Mar. 2012, pp. 666-672.

Chieh Hsieh et al: "Photoelectrochemical Liftoff of Patterned Sapphire Substrate for Fabricating Vertical Light-Emitting Diode", IEEE Photonics Technology Letters, vol. 24, No. 19, Oct. 1, 2012, pp. 1775-1777.

Carvalho et al., "Truncation of CPC Solar Collectors and its Effect on Energy Collection," Solar Energy, vol. 35, No. 5, pp. 393-399 (1985).

Chemisana et al., "Building Integrated Concentrating Photovoltaics: A Review," Renewable & Sustainable Energy Reviews, vol. 15, No. 1, pp. 603-611 (Jan. 1, 2011).

Lee et al., "Epitaxial Lift-off of GaAs Thin-film Solar Cells Followed by Substrate Reuse," 38th IEEE Photovoltaic Specialists Conference (PVSC), pp. 1698-1700 (Jun. 3-8, 2012).

Lee et al., "Multiple Growths of Epitaxial Lift-off Solar Cells From a Single InP Substrate," Appl. Phys. Lett., vol. 97, No. 10, pp. 101107-101109 (Sep. 8, 2010).

Lee et al., "Reuse of GaAs Substrates for Epitaxial Lift-off by Employing Protection Layers," J. Appl. Phys., vol. 111, No. 3, pp. 33527-33532 (Feb. 1, 2012).

Van Geelen et al., "Epitaxial Lift-off GaAs Solar Cell From a Reusable GaAs Substrate," Materials Science and Engineering: B, vol. 45, Nos. 1-3, pp. 162-171 (Mar. 1, 1997).

Van Niftrik et al., "The Influence of $In_xGa_{1-x}As$ and $GaAs_{1-y}P_y$ Layers Surrounding the AlAs Release Layer in the Epitaxial Lift-Off Process," Cryst. Growth Des., vol. 7, No. 12, pp. 2472-2480 (Nov. 17, 2007).

STRAIN RELIEF EPITAXIAL LIFT-OFF VIA PRE-PATTERNED MESAS

This application claims the benefit of priority of U.S. Provisional Patent Application No. 62/134,833, filed Mar. 18, 2015, which is incorporated herein by reference in its entirety.

This invention was made with U.S. Government support under contract number W911NF-08-2-0004 awarded by the Army Research Office. The government has certain rights in the invention.

The subject matter of the present disclosure was made by, on behalf of, and/or in connection with one or more of the following parties to a joint university-corporation research agreement: The Regents of the University of Michigan and NanoFlex Power Corporation. The agreement was in effect on and/or before the date the subject matter of the present disclosure was prepared, and was made as a result of activities undertaken within the scope of the agreement.

Epitaxial lift-off (ELO) technology enables the separation of epilayers from a growth substrate by selectively etching a sacrificial layer grown between the epilayers and the growth substrate as shown in Makoto Konagai, Mitsunori Sugimoto & Kiyoshi Takahashi, "*High efficiency GaAs thin film solar cells by peeled film technology*", 45 Journal of Crystal Growth 277-280 (1978), and in Eli Yablonovitch et al., "*Extreme selectivity in the lift-off of epitaxial GaAs films*", 51 Appl. Phys. Lett. 2222 (1987). The epilayers then can be transferred to a secondary host substrate and can be further fabricated into various kinds of thin film devices such as solar cells, photodiode arrays, light emitting diodes, and FETs, as seen in, for example, Kyusang Lee et al., "*Non-Destructive Wafer Recycling for Low-Cost Thin-Film Flexible Optoelectronics*", 24 Adv. Funct. Mater. 4284-4291 (2014). However, it is observed that the conventional ELO process frequently results in a partially peeling-off of epilayers from the secondary host substrate that significantly damages the lifted off thin film epilayers, leading to a low yield of functional thin film devices fabricated on the transferred epilayers.

If an epitaxial layer partially peels off from the secondary host substrate during the transferring process, a cracked region may be generated on the transferred epilayers. FIG. 1 shows a possible schematic of this cracking process during a conventional ELO process. At the beginning of the process, a thin film comprising epilayers and a host substrate are both coated with metal (for example, Au) (FIG. 1 (top left)). The epi-sample and secondary host substrate are bonded (in some instances, through cold-weld bonding) (FIG. 1 (top middle)). The bonded sample is then dipped into dilute HF for ELO and the dilute HF etches the sacrificial layer (FIG. 1 (top right)). At the end of the ELO process, a small un-etched region may remain (FIG. 1 (top right)) lying at the center of the whole epi-sample. These small un-etched regions tend to peel off from the host substrate, possibly due to the reason that the strain induced during the bonding or ELO process is concentrated on a small region at the end of ELO process (FIG. 1 (bottom right)). As a result, the thin film comprising epilayers is peeled off at the center from the Au layer (FIG. 1 (bottom right)), and an epi-layer with a cracked region is generated (FIG. 1 (bottom middle)). The devices fabricated on these cracked regions show deleterious behavior, such as short circuiting, that reduces the fabrication yield of the overall device (FIG. 1 (bottom left)).

The devices and methods of the present disclosure are directed to overcoming the above problem and other shortcomings in the art. In particular, disclosed herein are methods to eliminate or reduce the peeling-off of epitaxial lifted-off thin film epilayers on secondary host substrates that allows for the fabrication of high yield ELO processed thin film devices. The methods employ patterned strain-relief trenches as described herein. An improvement in the quality of epitaxial lifted off thin film epilayers was experimentally demonstrated by comparing the fabrication yield of a large ELO processed thin film photodiode array with and without this method.

An ancillary benefit of the present methods is to increase the exposed area of the sacrificial layer, which can increase the etching rate of the sacrificial layer. Horng et al., "*Thin Film Solar Cells Fabricated Using Cross-Shaped Pattern Epilayer Lift-Off Technology for Substrate Recycling Applications,*" 59 IEEE Trans. Electron Devices 666-672 (2012), report a contiguous epitaxial layer with cross-shaped holes revealing a sacrificial etching layer, where each repeating unit of the structure is connected by a narrow portion. Such a configuration increases the exposed area of the sacrificial layer and decreases ELO release time, but also increases the stress on the epilayer and concentrates the stress at the narrow connecting portion.

Another envisioned benefit of the present disclosure is that it may be employed in conjunction with the techniques described in Kyusang Lee et al., "*Transforming the cost of solar-to-electrical energy conversion: Integrating thin-film GaAs solar cells with non-tracking mini-concentrators,*" 4 Light: Science & Applications e288 (2015), which is incorporated herein by reference, to transfer large area epilayers to secondary host substrates without damaging the epilayer due to stress, enabling a high throughput, non-destructive ELO (ND-ELO) wafer recycling process for large scale production of solar cells.

There is disclosed a method for fabricating a thin-film device comprising providing a growth structure comprising a growth substrate, a sacrificial layer, and an epilayer, wherein the sacrificial layer is disposed between the growth substrate and the epilayer. It is noted that any of the methods and techniques described herein may be performed using such a growth structure, which may also include additional layers as described herein or as known in the art. In one aspect, the method comprises depositing a photoresist layer (PR) over the epilayer, patterning one or more trenches through the photoresist layer using photolithography, wherein the one or more trenches expose an area of the underlying epilayer (FIG. 2 (top left)), patterning one or more trenches through the exposed area of the epilayer and through the sacrificial layer, wherein the one or more trenches expose an area of the underlying growth substrate (FIG. 2 (top middle)), removing the photoresist layer (FIG. 2 (top right)), depositing a metal layer over the epilayer (FIG. 2 (top right)), bonding the metal layer to a metal-coated host substrate (FIG. 2 (bottom right and bottom middle)), and performing epitaxial lift off of the epilayer by etching the sacrificial layer (FIG. 2 (bottom middle)).

In one aspect, the present disclosure is directed to a method for fabricating thin-film devices comprising, depositing a sacrificial layer over a growth substrate, depositing an epilayer over the sacrificial layer, depositing a photoresist layer over the epilayer, patterning one or more trenches through the photoresist layer using photolithography, wherein the one or more trenches expose an area of the underlying epilayer (FIG. 2 (top left)), patterning one or more trenches through the exposed area of the epilayer and through the sacrificial layer, wherein the one or more trenches expose an area of the underlying growth substrate (FIG. 2 (top middle)), removing the photoresist layer (FIG.

2 (top right)), depositing a metal layer over the epilayer (FIG. 2 (top right)), bonding the metal layer to a metal-coated host substrate (FIG. 2 (bottom right and bottom middle)), and performing epitaxial lift off of the epilayer by etching the sacrificial layer (FIG. 2 (bottom middle)).

In some embodiments, the process steps are performed in various different orders. In one embodiment, a method for fabricating thin-film devices comprises, depositing a sacrificial layer over a growth substrate, depositing an epilayer over the sacrificial layer, depositing a photoresist layer over the epilayer, patterning one or more trenches through the photoresist layer using photolithography, wherein the one or more trenches expose an area of the underlying epilayer, depositing a metal layer over the epilayer, removing the photoresist layer such that any portions of the metal layer overlying the photoresist layer are lifted off, exposing a different area of the underlying epilayer, patterning one or more trenches through the exposed different area of the epilayer, wherein the one or more trenches expose an area of the underlying sacrificial layer or, in some embodiments, an area of the underlying growth substrate, bonding the metal layer to a metal-coated host substrate, and performing epitaxial lift off of the epilayer by etching the sacrificial layer. As indicated, in this embodiment, the one or more trenches patterned through the exposed different area of the epilayer do not necessarily expose an area of the underlying growth substrate. Those one or more trenches may stop after exposing an area of the sacrificial layer or they may proceed through the sacrificial layer and expose an area of the growth substrate. In this embodiment, the one or more trenches patterned through the photoresist layer may be wider, and in many cases significantly wider, than the one or more trenches patterned through the exposed different area of the epilayer. This is because, in these embodiments, the photoresist patterned regions will receive the deposited metal layer and thus will cover the devices to be fabricated later. Thus, large areas of photoresist may be patterned according to these embodiments. In some embodiments, the one or more trenches patterned through the photoresist layer are wide enough to cover all or nearly all areas of epilayer to be manufactured into one or more thin-film devices.

In one embodiment, the method may comprise depositing a sacrificial layer over a growth substrate, depositing an epilayer over the sacrificial layer, depositing a metal layer over the epilayer, depositing a photoresist layer over the epilayer, patterning one or more trenches through the photoresist layer using photolithography, wherein the one or more trenches expose an area of the underlying metal layer, patterning one or more trenches through the exposed area of the metal layer, wherein the one or more trenches expose an area of the underlying epilayer, patterning one or more trenches through the exposed area of the epilayer, wherein the one or more trenches expose an area of the underlying sacrificial layer or, in some embodiments, an area of the underlying growth substrate, removing the photoresist layer, bonding the metal layer to a metal-coated host substrate, and, performing epitaxial lift off of the epilayer by etching the sacrificial layer. As indicated, in this embodiment, the one or more trenches patterned through the exposed area of the epilayer do not necessarily expose an area of the underlying growth substrate. Those one or more trenches may stop after exposing an area of the sacrificial layer or they may proceed through the sacrificial layer and expose an area of the growth substrate.

In one embodiment, the method may comprise depositing a sacrificial layer over a growth substrate, depositing an epilayer over the sacrificial layer, and then depositing a patterned layer of metal mesas over the epilayer such that an area of the epilayer is exposed, patterning one or more trenches through the exposed area of the epilayer, wherein the one or more trenches expose an area of the underlying sacrificial layer or, in some embodiments, an area of the underlying growth substrate, bonding the metal layer to a metal-coated host substrate, and performing epitaxial lift off of the epilayer by etching the sacrificial layer. In some embodiments, the patterned layer of metal mesas is deposited using a shadow mask.

In some embodiments, bonding the epilayer to the host substrate is achieved by cold-weld bonding. Cold-weld bonding is described, e.g., by Lee et al. in "Multiple growths of epitaxial lift-off solar cells from a single InP substrate" (Lee, K., Shiu, K.-T., Zimmerman, J. D., Renshaw, C. K. & Forrest, S. R. *"Multiple growths of epitaxial lift-off solar cells from a single InP substrate."* Appl. Phys. Lett. 97, 101107 (2010)), by Kim et al. in "Micropatterning of organic electronic devices by cold-welding" (Kim, C, Burrows, P. & Forrest, S. *"Micropatterning of organic electronic devices by cold-welding."* Science 288, 831-3 (2000)), and by Ferguson et al. in "Contact adhesion of thin gold films on elastomeric supports: cold welding under ambient conditions" (Ferguson, G. S., Chaudhury, M. K., Sigal, G. B. & Whitesides, G. M. *"Contact adhesion of thin gold films on elastomeric supports: cold welding under ambient conditions."* Science 253, 776-778 (1991)), which are incorporated herein by reference for their disclosure of cold-weld bonding.

The epilayer may comprise one or more active areas where devices may be fabricated. In one embodiment, a patterned trench divides one region of the epilayer comprising at least one device from another region. In one embodiment, one or more trenches divide an epilayer into two or more active area portions as shown in FIG. 3. FIG. 3 shows an epilayer 300 that is separated by a trench 302 into two active area regions 306. The active area regions 306 comprise an area that may comprise devices 304. In one embodiment, one or more trenches separate the total active area of an epilayer into one or more rows of active area portions. In one embodiment, one or more trenches separate the total active area of an epilayer to define a grid of active area portions. In one embodiment, an active area may comprise rows of devices, and trenches may separate every row. In one embodiment, an active area may comprise rows of devices, and trenches may separate every other row of devices or the trenches may be concentrated in areas expected to receive higher stress. In one embodiment, a trench separates the total active area to define a comb-like structure on the epilayer wherein the active area may still be a contiguous piece as shown in FIG. 4. FIG. 4 shows an epilayer 400 comprising an active area region 406 that is separated by trenches 402 into several active area portions 408. The trenches 402 in FIG. 4 are not necessarily between every row of devices 404. The devices in the active area 406 are not necessarily ordered into rows. FIGS. 3 and 4 are exemplary only. The various possibilities of combinations of epilayer active areas, trenches and devices in view of the present disclosure are within the purview of one of ordinary skill in the art.

In some embodiments, the one or more trenches of the present disclosure, such as the one or more trenches patterned through the epilayer, are about 500 microns or less in width, such as about 250 microns or less. In certain embodiments, the one or more trenches have a width ranging from about 200 microns to about 1 micron, about 150 microns to about 4 microns, about 100 microns to about 8 microns, about 60 microns to about 10 microns, or about 30 microns or any number in between. The one or more trenches may have the same or approximately the same width or can vary in width relative to one another. In some embodiments, at least one trench or all of the trenches may have a width of less than 1 micron. In one embodiment, the trenches may be patterned as rows in the epilayer. In one embodiment, the patterning feature may be a comb like structure with finger like protrusions. In one embodiment, the separation between features may be as small as possible such that the gap between the pieces is minimized, but the pieces of the epilayers do not touch. In another embodiment, the one or more trenches comprise all or nearly all of the area between devices in the active area of the epilayer.

In another aspect, the methods described herein are for eliminating the peeling-off of epitaxial lifted-off thin film epilayers on a secondary host substrate. This will permit the fabrication of high yield ELO processed thin film devices. In another aspect, the presently disclosed methods reduce the peeling off of epitaxial lifted-off thin film epilayers on a secondary host substrate. In one embodiment, the one or more trenches may be configured to relieve the stress of an epilayer. The present inventors believe, without wishing to be bound to a particular theory, that the one or more trenches patterned according to the present disclosure provide strain-relief during ELO thereby reducing or eliminating the peeling off of epilayers as observed in conventional ELO processes.

Stress may be defined as the force exerted upon atoms or sub-elements of a continuous material by adjacent atoms or sub-elements. In one embodiment, stress between two layers may be relieved by physically separating the two layers. Stress may be increased locally in areas that have sharp corners. Not all the embodiments are devoid of sharp corners to relieve the stress, as a sharp corner may be introduced to decrease stress at another location on the epilayer. Non-limiting examples of stress include the stress developed on a surface during the deposition of two non-lattice matched epilayer, stress created during the transfer or epitaxial liftoff processes, or from external forces. Stress may accumulate over a range of lengths or areas or volumes. In one aspect the present disclosure is directed to method to relieve stress in an epilayer where stress may be an average, a median or maximum stress at a local point or region. In another aspect stress may be shear stress or normal stress. Without being limited to a single theory for operation, it is believed that the one or more trenches may relieve stress within the active area or between devices.

In one embodiment, the patterning steps are configured or performed to reduce at least one of cracked epilayers, partial peel off of epilayers and short circuited devices after the epitaxial liftoff process.

The advantages of the present disclosure may be particularly realized when employing an epilayer with a large active area, as large active areas tend to be more susceptible to the effects of stress and thereby further benefit from the stain-reducing trenches of the present disclosure. In some embodiments, the active area of the epilayer is at least 10,000 square microns. In some embodiments, the area may range from about 10,000 square microns to about 1 square inch, such as from about 100,000 square microns to about 300,000,000 square microns, from about 500,000 square microns to about 150,000,000 square microns, or from about 1,000,000 square microns to about 100,000,000 square microns, or any number in between.

The epilayer may comprise any material that may be desirable for use in a thin-film device. In some embodiments, the epilayer comprises one or more active materials that may be desirable for use in a photosensitive device, such as a photovoltaic device. In some embodiments, the epilayer comprises at least one III-V material. In some embodiments, the epilayer comprises Si.

The growth substrate may comprise any number of materials, including single crystal wafer materials. In some embodiments, the growth substrate is a single crystal wafer. In some embodiments, the growth substrate may comprise a material chosen from Germanium (Ge), Si, GaAs, InP, GaP, GaN, GaSb, AlN, SiC, CdTe, sapphire, and combinations thereof. In some embodiments, the growth substrate comprises GaAs. In some embodiments, the growth substrate comprises InP. In some embodiments, the materials comprising the growth substrate may be doped. Suitable dopants may include, but are not limited to, Zinc (Zn), Mg (and other group IIA compounds), Zn, Cd, Hg, C, Si, Ge, Sn, O, S, Se, Te, Fe, and Cr. For example, the growth substrate may comprise InP doped with Zn and/or S. Unless otherwise indicated, it should be understood that reference to a layer comprising, e.g., InP encompasses InP in its undoped and doped (e.g., p-InP, n-InP) forms. Suitable dopant selections may depend, for example, on the semi-insulating nature of a substrate, or any defects present therein. The "growth substrate" as used herein may include a buffer layer that has been deposited over the growth substrate, as known in the art. Thus, the patterning step that "exposes an area of the underlying growth substrate," includes instances where an area of the growth substrate buffer layer is exposed.

The sacrificial layer acts as a release layer. The sacrificial layer may be chosen to have a high etch selectivity relative to the epilayer and/or the growth substrate such that the sacrificial layer can be removed while minimizing or eliminating etching of the epilayer and/or growth substrate. In some embodiments, the sacrificial layer comprises a III-V material. In some embodiments, the III-V material is chosen from AlAs, AlInP, and AlGaInP. In certain embodiments, the sacrificial layer comprises AlAs. In some embodiments, the sacrificial layer has a thickness in a range from about 2 nm to about 200 nm, such as from about 4 nm to about 100 nm, from about 4 nm to about 80 nm, or from about 4 nm to about 25 nm, or any number in between.

Protective layers or other intermediate layers may be disposed between the growth substrate and the sacrificial layer and/or the sacrificial layer and the epilayer. Protective layers serve to protect the growth substrate and/or the epilayer during the epitaxial lift off process, allowing for continuous reuse of the growth substrate. U.S. Pat. No. 8,378,385 and U.S. Patent Publication No. US 2013/0043214 are incorporated herein by reference for their disclosure of protective layer schemes. It should be understood from the present disclosure that if protective layers or other intermediate layers are employed, it may be necessary to pattern the one or more trenches of the present disclosure through the protective layers or intermediate layers to realize the benefits described herein. For example, if one or more protective layers or intermediate layers are disposed between the sacrificial layer and the epilayer, the one or more trenches should be patterned through the exposed area of the epilayer and through the protective layers or other intermediate layers. This may be achieved, for example, through the use of one or more etchants. If one or more protective layers or intermediate layers are disposed between the growth substrate and the sacrificial layer, the one or more trenches may be patterned through the exposed area of the epilayer and through the sacrificial layer, wherein the one or more trenches expose an area of an underlying protective layer or intermediate layer, or, optionally, the one or more trenches may also be patterned through the protective layers or intermediate layers to expose an area of the underlying growth substrate.

In some embodiments, bonding the epilayer to the host substrate is performed via at least one of cold-weld bonding and van-der Waals bonding. In some embodiments, the host substrate may be chosen from at least one of a plastic substrate, a semiconductor substrate and a metallic substrate.

Another aspect of the present disclosure is directed to a thin-film device, comprising an epilayer, wherein an active area of the epilayer has a gap that separates at least one region that may contain at least one device from at least one other region, and a host substrate. In one embodiment, the gap separates the total active area of the epilayer into two or more active area portions to define one or more rows of active area portions. In one embodiment, the active area of the device is at least 10,000 square microns. In one embodiment, the active area is at least 100,000 square microns or has an area according to the active area dimensions described herein. In one embodiment, the epilayer comprises at least one III-V material.

DETAILED DESCRIPTION

As used herein, the singular forms "a," "an," and "the" include plural reference unless the context dictates otherwise.

As used herein, the term "layer," including "epitaxial layer" and "epilayer," refers to a member or component of a device whose primary dimension is X-Y, i.e., along its length and width. It should be understood that these terms are not limited to single layers or sheets of materials, but rather can comprise multiple layers or sheets of materials. It should also be understood that a layer is not necessarily continuous. For example, depositing a metal layer over a patterned photoresist layer or a patterned epilayer as described herein may not result in a continuous metal layer.

When a first layer is described as disposed or deposited "over" or "above" a second layer, the first layer is positioned further away from the substrate of the structure. The first layer may be in direct contact with the second layer or there may be other layers between the first layer and the second layer. For example, a sacrificial layer may be described as disposed "over" or "above" a growth substrate, even though there may be various layers in between. Similarly, when a first layer is described as disposed or deposited "between" a second layer and a third layer, there may be other layers between the first layer and the second layer, and/or the first layer and the third layer.

As used herein, the term "III-V material," may be used to refer to compound crystals containing elements from group IIIA and group VA of the periodic table. More specifically, the term "III-V material" may be used herein to refer to compounds which are combinations of the group of Gallium (Ga), Indium (In) and Aluminum (Al), and the group of Arsenic (As), Phosphorous (P), Nitrogen (N), and Antimony (Sb).

Suitable deposition methods for preparing the layers of the present disclosure include, but are not limited to, gas source molecular beam epitaxy, MOCVD (metallo-organic chemical vapor deposition), MOVPE (metallo-organic vapor phase epitaxy), HVPE (hydride vapor phase Epitaxy), solid source MBE, and chemical beam epitaxy.

Figure 1:
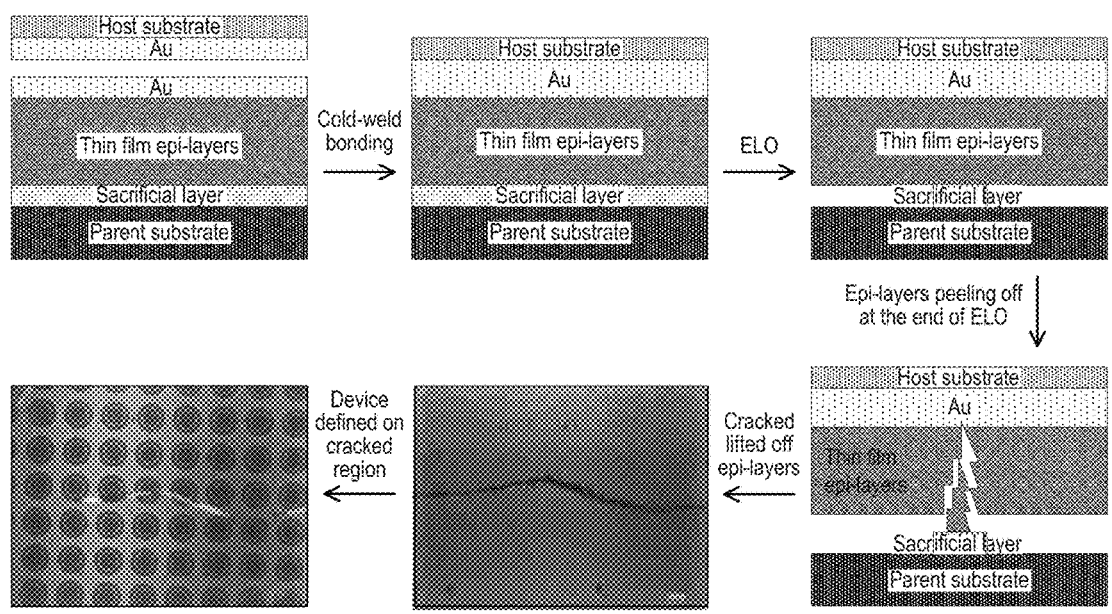
FIG. 1 is a schematic of a conventional ELO process that results in the formation of a crack in the epilayer.
Figure 2:
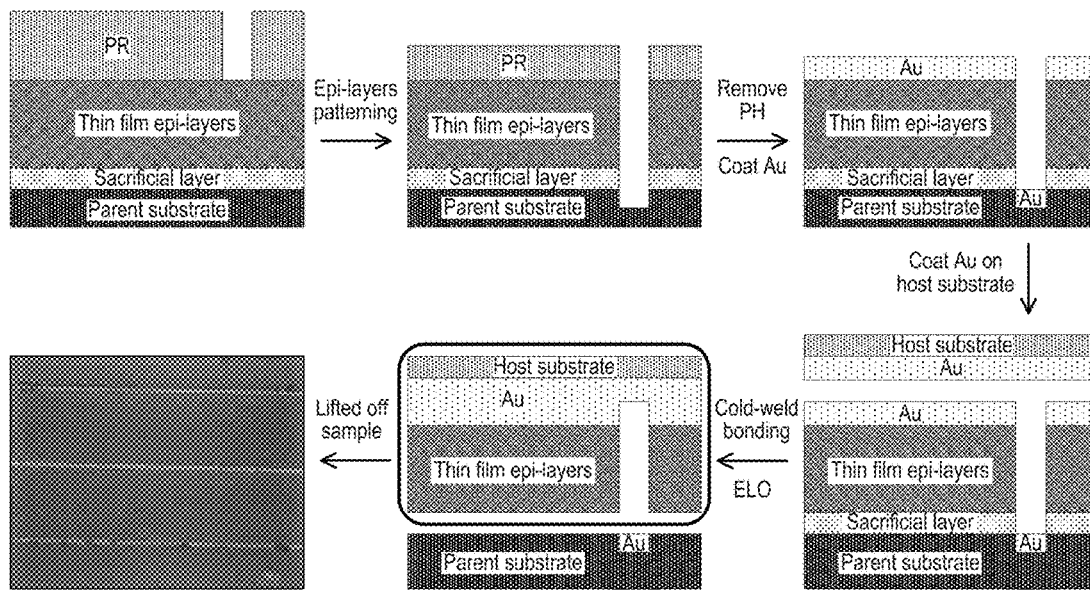
FIG. 2 shows an exemplary method of the present disclosure to eliminate or reduce cracking in the epilayer from ELO process.
Figure 3:
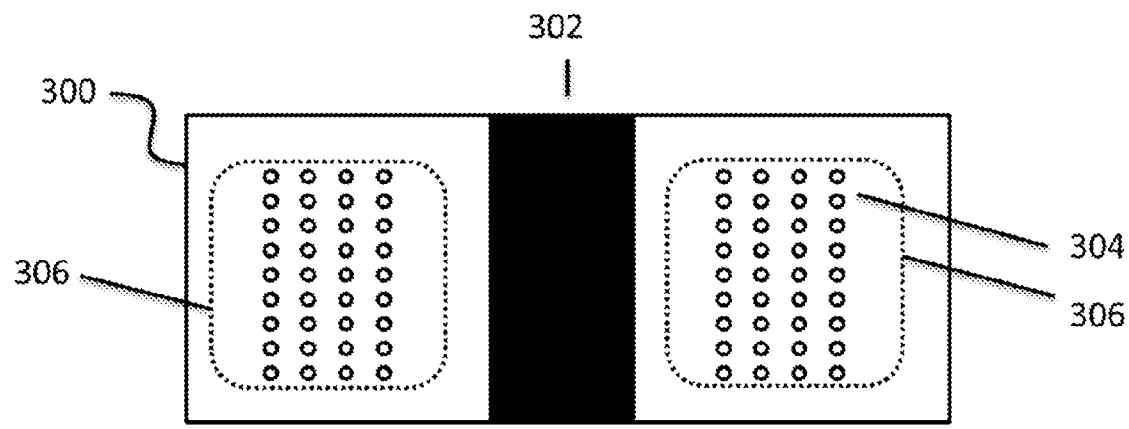
FIG. 3 shows an example of an epilayer patterned with a trench to separate the active area into two portions.
Figure 4:
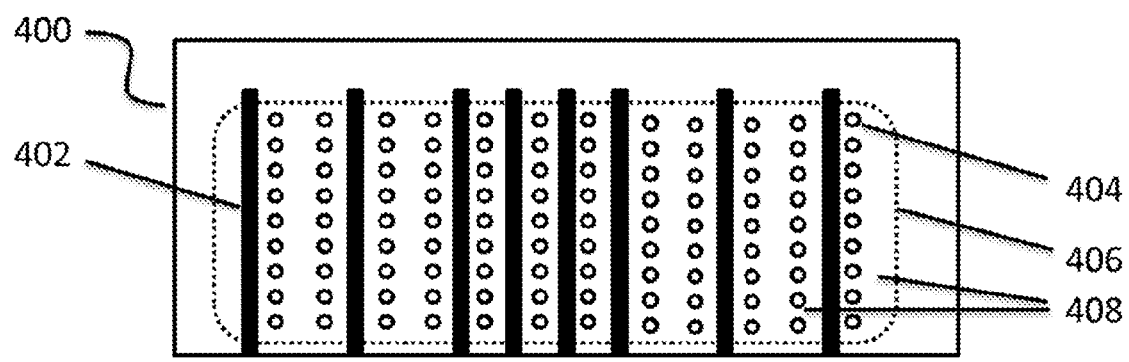
FIG. 4 shows an example of an epilayer patterned with trenches to separate the active area into finger like protrusions.

The working examples herein are non-limiting examples, with a true scope of the present disclosure being indicated by the claims included with this specification and their equivalents FIG. 2 shows an exemplary fabrication method as performed according to the present disclosure. After epitaxial growth of an epilayer and a sacrificial layer, photoresist was spun-on the epilayer and a pattern was formed on the photoresist using photolithography (FIG. 2 (top left)). In some embodiments, the patterned formed on the photoresist may be a substantially straight line, such that the pattern after etching resembles a trench. In other embodiments, the pattern may not be a straight line. In this exemplary embodiment, the pattern formed on the photoresist was patterned on regions where no devices that would be later fabricated. Next, the epilayers were etched along the patterned photoresist layer using chemical wet-etching (this technique is exemplary only; other patterning techniques such as plasma etching techniques can be used consistent with the present disclosure). During the etching process, the epilayers were etched all the way through to the growth substrate, leaving a sacrificial etching front open on the sacrificial layer (FIG. 2 (top middle)). Then, the patterned photoresist layer was removed and Au was coated on both the epilayer and on a secondary host substrate (FIG. 2 (top right)). The two metal layers were then bonded (FIG. 2 (bottom right)), followed by an ELO process (FIG. 2 (bottom middle)). After the ELO process, the lifted-off epilayers on the secondary host substrate were checked under a microscope. The effectiveness of the method was confirmed by the electron microscope image showing an epilayer without any obvious cracks (FIG. 2 (bottom left)).

The above procedure can be done in different orders. In one embodiment, after the epitaxial growth, photoresist may be spun-on the epilayer and patterned using photolithography such that these patterned regions cover the regions where devices would be later fabricated. Then an Au layer may be deposited on the epilayer and the photoresist layer may be subsequently removed resulting in the lift off of some of the deposited Au to form Au raised portions or mesas. Next, the epilayers may be patterned using chemically wet-etched or plasma etched all the way through the epilayers to the growth substrate, leaving a sacrificial etching front open for the sacrificial layer. Then, Au may be deposited on a host substrate, and the epilayer may be bonded to the host substrate, followed by the ELO process.

In another embodiment, after epitaxial growth, Au may be deposited on an epilayer. Then, photoresist may be spun-on the epilayer and a pattern for several photoresist trenches may be made using photolithography. The trenches may be patterned on regions where devices would not be later fabricated. Next, Au may be chemically wet-etched or plasma etched to form Au mesas. Then the epilayers may be patterned using chemical wet-etching or plasma etching all the way through the epilayers to the growth substrate, leaving a sacrificial etching front open. Then, the photoresist may be removed from the epilayers. A layer of Au may be deposited on a host substrate and then the host substrate may be bonded to the sacrificial layer and the ELO process may be performed.

If sample dicing is desirable in any of the above methods, a dicing process can be performed at any step during the procedure.

One benefit of an exemplary pre-patterning method on the yield improvement of ELO processed thin film devices is demonstrated below a reduction of individual photodiode devices with poor dark current performance A linearly connected 8×100 p-i-n thin-film InGaAs photodiode array was fabricated on a sample where the exemplary pre-patterning method was used and compared against a sample that did not employ a pre-patterning method. Epilayer structures were grown by gas-source molecular beam epitaxy (GSMBE) on Zn-doped (100) p-InP substrates. In the exemplary embodiment, the growth began with the deposition of an unintentionally doped InP (0.2 μm) buffer layer, followed by a 12 nm thick AlAs sacrificial layer. Next, an inverted active InGaAs p-i-n photodiode structure was grown with the following layers: a $2\times10^{18}$ $cm^{-3}$ Be-doped p-InP top window/contact layer (0.2 μm thick), an unintentionally doped i-$In_{0.53}Ga_{0.47}As$ absorption layer (1.6 μm thick), and a $5\times10^{18}$ $cm^{-3}$ Si-doped n-$In_{0.53}Ga_{0.47}As$ bottom contact layer (0.1 μm thick).

For the patterning step, after the growth of the epilayers, the wafer comprising the epilayers was coated with 300 nm LOR3A and 7 μm SPR220 (7.0) double layers photoresist. The wafer comprising the epilayers was then diced into 4 mm×33 mm epi-samples using an ADT 7100 dicing saw. Then, three equally separated photoresist trenches (30 μm wide) were patterned along the long side of the epilayers using an MJB exposure tool and a MF-319 developer. The pattern for the epilayers was plasma etched ($Cl_2$: $H_2$=16:12 sccm) using an Oxford inductively coupled plasma reactive ion etch (ICP RIE). The pattern formed trenches that were etched all the way through epilayers to the growth InP substrate. Then, the layers of photoresist were removed by soaking the samples of epilayers in Remover PG for 5 hours (For comparison, after the deposition steps up to this step in the procedure the control sample without a pre-patterning step only underwent the dicing step).

After removing the photoresist layers, 250 nm thick Au films were deposited on the epilayers of both the samples with and without the pre-patterning step, and also on two 25 μm thick Kapton host substrates. Each epilayer was bound to a different host substrate through the Au surfaces via the application of heat and pressure. Using an EVG 520 wafer bonder under $\sim10^{-5}$ torr vacuum, 20 MPa of pressure was applied to establish a bond between the two gold films with a 500 N/sec ramping rate. Ramping the temperature at 45° C./min to 200° C., and holding at the peak temperature for 5 min carried out the thermally assisted bonding process. A reusable, soft graphite sheet was inserted between the sample and the press head to apply a uniform force over the sample area. Once the epilayer was bonded to the Kapton substrate, the epilayer was removed from its growth InP substrate through the ELO process, which enables the layer to be later fabricated into a thin film device. Accordingly, the entire sample was immersed in a 20% HF acid maintained at 60° C. The HF acid was agitated with a stir bar at 400 rpm. Due to the high etch selectivity between AlAs and the active compound semiconductor layers, the dilute HF removed the 12 nm thick AlAs sacrificial layer between the wafer and active device epilayers without attacking the adjacent layers.

After the ELO process, the transferred epilayers together with the respective host substrates, were fixed to a rigid substrate for the convenience of the following fabrication. 8×100 front ring contacts were patterned by photolithography and deposition of a Ti (20 nm)/Pt (30 nm)/Au (200 nm) metal contact. The width of each ring was 10 microns, and the inner diameter was 150 microns. After the metal layer lift-off, 8×100 mesas were defined by photolithography. These mesas were 200 micron diameter circles centered at the position of ring contacts. Mesas were plasma etched using ($Cl_2$: $H_2$=16:12 sccm) using Oxford ICP RIE. The plasma etching patterned mesas all the way through the transferred epilayers to the bottom Au layer.

Next, 8 bottom linear contact lines were patterned using photolithography and wet TFA Au etchant. Each contact line linearly connected 100 photodiode mesas in a row. Then, a 1 micron thick PI-2610 polyimide layer was spun-on the sample, followed by a hard baking at 300° C. for 30 mins to form an insulating layer. This process also helped the formation of the top and bottom ohmic contacts. A polyimide insulating layer was then patterned using photolithography and plasma etching ($CF_4$: $O_2$=56:16 sccm), leaving the photodiode device area exposed. Then 100 front linear contact lines were patterned with a Ti (10 nm)/Au (300 nm) deposited using e-beam evaporation. Each contact line linearly connected 8 photodiode mesas in a column. A double layer $MgF_2$ (37 nm) and $TiO_2$ (127 nm) anti-reflection coating (ARC) was deposited to finish the fabrication of this exemplary embodiment.

Figure 5:
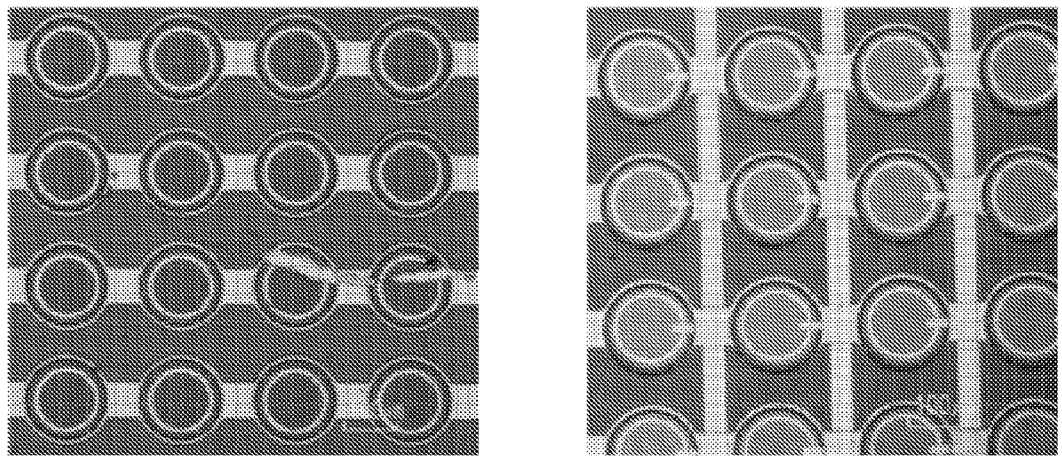
FIG. 5 shows microscopic image of photodiode devices fabricated on transferred epilayers with and without pre-patterning.
Figure 6:
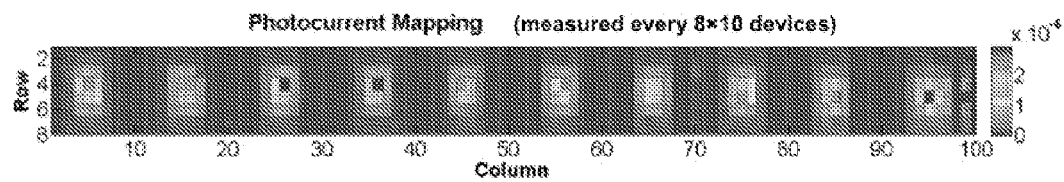
FIG. 6 shows photocurrent mapping of an exemplary 8×100 photodiode array.

The dark current of individually photodiode devices on the sample were measured to confirm the fabrication yield improvement of employing pre-patterning method. All measured photodiode devices are biased under −1V, and the generated photocurrent of these devices were collected by a Keithley 2400 SMU. FIG. 5 (left) shows that without the pre-patterning method, the transferred epilayers shows regions with obvious cracks, and any devices defined on these cracked regions are measured to be short circuited (187/800). Without measuring all 800 devices, the fabrication yield is <77% (613/800). In samples using the pre-patterned method, no obvious cracked regions are observed on either the initially transferred epilayers, or on the epilayers after the fabrication (FIG. 5 (right)). All 800 devices were measured using a 10 mW 1550 nm laser illuminating on 10 different spots of the whole array. The results show that one device was shorted and nine devices were highly leaky (dark current comparable to 10 mW 1550 nm laser illuminating photocurrent) under −1 V reverse bias condition (FIG. 6). Thus the fabrication yield was confirmed to be ~99% (790/800) by employing this exemplary pre-patterning method.

Other embodiments of the devices and methods described herein will be apparent to those skilled in the art from consideration of the specification and practice. It is intended that the specification be considered as exemplary only, with the true scope of the devices and methods described being indicated by the claims.

What is claimed is:

1. A method of fabricating a thin film device, comprising:
   a. depositing a sacrificial layer over a growth substrate;
   b. depositing an epilayer over the sacrificial layer;
   c. depositing a photoresist layer over the epilayer;

d. patterning one or more trenches through the photoresist layer using photolithography, wherein the one or more trenches expose an area of the underlying epilayer;
e. depositing a metal layer over the epilayer;
f. removing the photoresist layer such that any portions of the metal layer overlying the photoresist layer are lifted off, exposing a different area of the underlying epilayer;
g. patterning one or more trenches through the exposed different area of the epilayer, wherein the one or more trenches expose an area of the underlying sacrificial layer or an area of the underlying growth substrate;
h. bonding the metal layer to a metal-coated host substrate; and
i. performing epitaxial lift off of the epilayer by etching the sacrificial layer.

2. The method of claim 1, wherein the one or more trenches of step g separate the epilayer into one or more rows.

3. The method of claim 1, wherein the one or more trenches of step g are configured to relieve the stress of the epilayer.

4. The method of claim 1, wherein the one or more trenches of step g are configured to reduce at least one of cracked epilayers, partial peel off of epilayers, and short-circuited devices after the epitaxial lift-off process.

5. The method of claim 1, wherein the epilayer has an area of at least 10,000 square microns.

6. The method of claim 5, wherein the area is in a range from about 1,000,000 square microns to about 100,000,000 square microns.

7. The method of claim 1, wherein the epilayer comprises at least one of Si and III-V semiconductors.

8. The method of claim 1, wherein the metal layer is bonded to the metal-coated host substrate by at least one of cold-weld bonding and van-der Waals bonding.

9. The method of claim 1, wherein the host substrate is chosen from a plastic substrate, a semiconductor substrate, and a metallic substrate.

10. The method of claim 1, wherein the one or more trenches of step g are 250 microns or less in width.

11. A method of fabricating a thin film device, comprising:
a. depositing a sacrificial layer over a growth substrate;
b. depositing an epilayer over the sacrificial layer;
c. depositing a metal layer over the epilayer;
d. depositing a photoresist layer over the epilayer;
e. patterning one or more trenches through the photoresist layer using photolithography, wherein the one or more trenches expose an area of the underlying metal layer;
f. patterning one or more trenches through the exposed area of the metal layer, wherein the one or more trenches expose an area of the underlying epilayer;
g. patterning one or more trenches through the exposed area of the epilayer, wherein the one or more trenches expose an area of the underlying sacrificial layer or an area of the underlying growth substrate;
h. removing the photoresist layer;
i. bonding the metal layer to a metal-coated host substrate; and
j. performing epitaxial lift off of the epilayer by etching the sacrificial layer.

12. The method of claim 11, wherein the one or more trenches of step g separate the epilayer into one or more rows.

13. The method of claim 11, wherein the one or more trenches of step g are configured to relieve the stress of the epilayer.

14. The method of claim 11, wherein the one or more trenches of step g are configured to reduce at least one of cracked epilayers, partial peel off of epilayers, and short-circuited devices after the epitaxial lift-off process.

15. The method of claim 11, wherein the epilayer has an area of at least 10,000 square microns.

16. The method of claim 15, wherein the area is in a range from about 1,000,000 square microns to about 100,000,000 square microns.

17. The method of claim 11, wherein the epilayer comprises at least one of Si and III-V semiconductors.

18. The method of claim 11, wherein the metal layer is bonded to the metal-coated host substrate by at least one of cold-weld bonding and van-der Waals bonding.

19. The method of claim 11, wherein the host substrate is chosen from a plastic substrate, a semiconductor substrate, and a metallic substrate.

20. The method of claim 11, wherein the one or more trenches of step g are 250 microns or less in width.

* * * * *